(12) United States Patent
Bammer et al.

(10) Patent No.: US 8,929,972 B2
(45) Date of Patent: Jan. 6, 2015

(54) ARTERIAL SPIN LABELING MRI-BASED CORRECTION FACTOR FOR IMPROVING QUANTITATIVE ACCURACY OF BLOOD FLOW AND VOLUME IMAGES

(75) Inventors: Roland Bammer, Palo Alto, CA (US); Greg Zaharchuk, Stanford, CA (US)

(73) Assignee: The Board of Trustees of the Leland Stanford Junior University, Palo Alto, CA (US)

( * ) Notice: Subject to any disclaimer, the term of this patent is extended or adjusted under 35 U.S.C. 154(b) by 330 days.

(21) Appl. No.: 12/798,280

(22) Filed: Mar. 31, 2010

(65) Prior Publication Data

US 2011/0245656 A1    Oct. 6, 2011

(51) Int. Cl.
*A61B 5/05* (2006.01)
*G01R 33/563* (2006.01)

(52) U.S. Cl.
CPC .............................. *G01R 33/56366* (2013.01)
USPC .......................................... 600/411; 600/419

(58) Field of Classification Search
CPC .......................... G01R 33/56366; A61B 5/055
USPC .................................................. 600/411, 419
See application file for complete search history.

(56) References Cited

U.S. PATENT DOCUMENTS

| | | |
|---|---|---|
| 2007/0167731 A1 | 7/2007 | Taxt et al. |
| 2008/0119720 A1 | 5/2008 | Carroll et al. |

OTHER PUBLICATIONS

Knutsson et al., Absolute quantification of cerebral blood flow: correlation between dynamic susceptibility contrast MRI and model-free arterial spin labeling, Available online, Aug. 19, 2009, Magnetic Resonance Imaging 28, 1-7.*
Ibaraki et al., Cerebral vascular mean transit time in healthy humans: a comparative study with PET and dynamic susceptibility contrast-enhanced MRI, Published online May 17, 2006, Journal of Cerebral Blood Flow & Metabolism (2007) 27, 404-413.*
Knutsson et al., Absolute quantification of cerebral blood flow in normal volunteers: correlation between Xe-133 SPECT and dynamic susceptibility contrast MRI, J Magn Reson Imaging. Oct. 2007;26(4):913-20.*
Petersen et al., Model-Free Arterial Spin Labeling Quantification Approach for Perfusion MRI, Magnetic Resonance in Medicine 55:219-232, 2006.*
Ostergaard, "High resolution measurement of cerebral blood flow using intravascular tracer bolus passages. Part II: Experimental comparison and preliminary results" (abstract), 1996, pp. 726-736, Magn. Res. Med. 36(5).

(Continued)

*Primary Examiner* — Long V Le
*Assistant Examiner* — Bo J Peng
(74) *Attorney, Agent, or Firm* — Lumen Patent Firm

(57) ABSTRACT

Arterial spin labeling MRI is used to provide a patient specific correction factor to correct a image provided by a non-ASL imaging modality (e.g., DSC MRI). More specifically, a first blood flow image is taken using the non-ASL imaging modality, and a corresponding second blood flow image is taken with ASL. Some or all of the voxels in the first image are selected according to a predetermined selection method. A correction factor (CF) is computed to be the ratio of second image BF to first image BF averaged over the selected voxels. Thus, CF is the average of ASL/non-ASL blood flow over the selected voxels. This correction factor is applied to all voxels of an image equally, but can differ from patient to patient. This correction can be applied to one or more non-ASL blood flow images.

11 Claims, 5 Drawing Sheets

(56) References Cited

OTHER PUBLICATIONS

Mukherjee et al., "Measurement of cerebral blood flow in chronic carotid occlusive disease: Comparison of dynamic susceptibility contrast perfusion MR Imaging with positron emission tomography", 2003, pp. 862-871, Am. J. Neuroradiol. 24.

Lin et al., "Quantitative measurements of cerebral blood flow in patients with unilateral carotid artery occlusion: a PET and MRI study", 2001, pp. 659-667, J. MRI 14.

Sakaie et al., "Method for improving the accuracy of quantitative cerebral perfusion imaging", 2005, pp. 512-519, J. MRI 21.

* cited by examiner

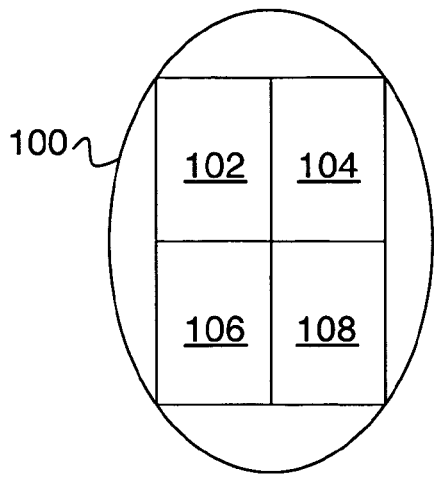
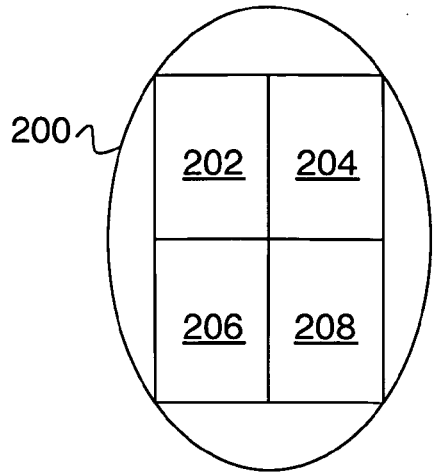
Fig. 1a                Fig. 1b
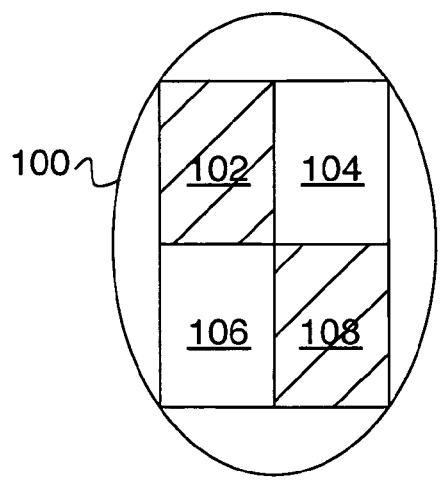
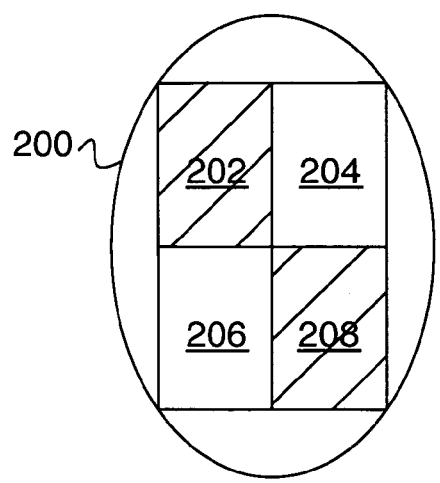
Fig. 1c                Fig. 1d
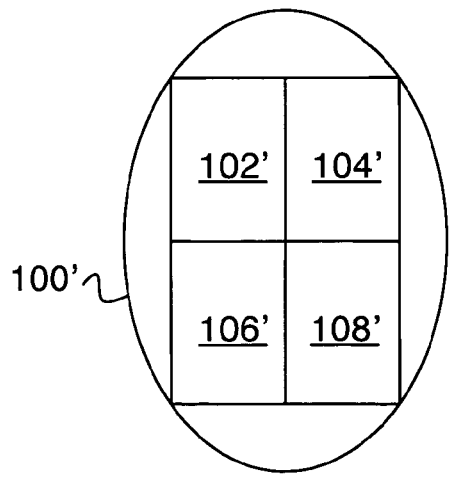
Fig. 1e

ARTERIAL SPIN LABELING MRI-BASED CORRECTION FACTOR FOR IMPROVING QUANTITATIVE ACCURACY OF BLOOD FLOW AND VOLUME IMAGES

FIELD OF THE INVENTION

This invention relates to providing corrections for quantitative medical imaging.

BACKGROUND

Over the past few decades, medical imaging techniques have been extensively investigated and various applications have been developed. One such application is the measurement of blood flow (e.g., cerebral blood flow (CBF)). CBF images can be relative or quantitative. In a relative CBF image, regions of high flow are distinguished from regions of low flow, but there is no quantitative scale for the imaging results. A quantitative CBF image provides this scale, and usefully provides more complete information. For example, quantitative CBF can help determine whether or not regions of relatively low blood flow have a blood flow that falls below a critical level (e.g., as can occur in a stroke patient).

However, it has proven to be difficult to obtain quantitative CBF images, especially in cases where a non-invasive imaging modality is employed, such as magnetic resonance imaging (MRI). For example, absolute quantitation of dynamic susceptibility contrast (DSC) MRI is challenging due to many uncertainties, including partial volume errors and the nonlinear contrast relaxivity. Arterial spin labeling (ASL) MRI can measure quantitative CBF in regions with rapidly-arriving flow, but CBF is underestimated in regions with delayed arrival.

Several methods have been considered to improve quantitative MRI CBF measurements, with varying levels of success. Lin et al. described a method that derived a correction factor normalizing the area-under-the-curve of the individual patient's superior sagittal sinus (SSS) with the mean value derived from a small cohort of young normal volunteers (J. MRI 14:659-667, 2001). Mukherjee et al. described scaling the individual measurements such that a deep white matter region of interest (ROI) was fixed to be 22 ml/100 g/min, which is a value derived from PET studies. However, Mukherjee et al. reported that this scaling approach did not significantly improve the correlation of DSC and gold-standard PET CBF measurements (Am. J. Neuroradiol. 24:862-871, May 2003). Sakaie et al. demonstrated a method in which steady-state cerebral blood volume (CBV) measurements obtained using T1-weighted images before and after bolus contrast passage could be used to determine a patient-specific correction factor, with the assumption that there is slow-exchange between intra- and extravascular water on the time scale of the measurement (J. MRI 21:512-519, 2005).

In view of the mixed results and added complications of existing blood flow image correction approaches, it would be an advance in the art to provide improved quantitative blood flow image correction.

SUMMARY

Arterial spin labeling MRI is used to provide a patient specific correction factor to correct a image provided by a non-ASL imaging modality (e.g., DSC MRI). More specifically, a first blood flow image is taken using the non-ASL imaging modality, and a corresponding second blood flow image is taken with ASL MRI. Some or all of the voxels in the first image are selected according to a predetermined selection method. Since the first and second images correspond, this selection amounts to selecting the same set of voxels in both images. A correction factor (CF) is computed to be the ratio of second image BF to first image BF averaged over the selected voxels. Thus, CF is the average of ASL/non-ASL blood flow over the selected voxels. This correction factor is applied to all voxels of an image equally, but can differ from patient to patient. This correction can be applied to one or more non-ASL images. For example, DSC CBF and CBV images can both be corrected using the same correction factor obtained using the DSC and ASL CBF images. The corrected images can be provided as an output.

FIGS. 1a-e schematically show these steps. FIG. 1a shows a first blood flow image 100 having voxels 102, 104, 106, and 108. For ease of illustration, only 4 voxels are shown in this example, but it is understood that images having any number of voxels can be corrected with the present approach, and that the number of voxels typically encountered in practice is much higher than 4. The imaging modality for first image 100 can be any non-ASL imaging modality (e.g., positron emission tomography (PET), single photon emission computed tomography (SPECT), computed tomography perfusion (CTP), computed tomography, MRI etc.), and is preferably a non-invasive modality (e.g., MRI). If MRI is employed to provide this first image, gradient echo MRI, spin echo MRI, or any combination of these can be employed.

FIG. 1b shows a corresponding ASL MRI blood flow image 200 having voxels 202, 204, 206, and 208. Images 100 and 200 are corresponding blood flow images, such that voxels 102, 104, 106, and 108 correspond to voxels 202, 204, 206, and 208 respectively. Methods for establishing such correspondence are known in the art, and are therefore not described. Images 100 and 200 can be of any part of a patient's body, such as the brain, heart, or any other internal organ, tissue or structure.

FIG. 1c shows the result of selecting some or all of the voxels in image 100. The selected voxels are hatched. Since ASL MRI tends to be more accurate in regions with normal blood arrival times, this selection can serve to preferentially include such regions in the averaging to obtain the correction factor. However, selecting all of the voxels in this step is also possible. In cases where some of the voxels are selected, various selection methods are possible. In the example described in detail below, selection is based on using a Tmax image to identify regions of normal blood arrival time (e.g., a Tmax threshold can be set somewhere in a range from 2 s to 4 s). The selection method for this step can also be based on other approaches, such as selecting according to: tissue type; baseline blood flow, and/or presence/absence of pathology.

The selection method can also include applying a weighting factor to the selected voxels. For example, a weighting factor can be applied that is a decreasing function of Tmax, such that voxels that have small Tmax are more heavily weighted in the average than voxels having large Tmax. Such weighting can be done in combination with selecting all or some of the voxels. FIG. 1d shows the corresponding selected voxels in image 200, based on the selection made in image 100. It is also possible for the selection of voxels to have been made first in image 200, in which case the corresponding voxels in image 100 would also be selected. In either case, the result is corresponding sets of selected voxels in both the first and second images. More generally, voxels can be selected according to the results from the first image, second image, and/or any other images or data. For example, multiple post-label delay times can be used in the ASL imaging to obtain a delay map from the ASL imaging which can be used for selecting the voxels.

The correction factor CF is computed by averaging ASL/non-ASL blood flow values over the selected voxels. In this example, the averaging would include the ratios $BF_{202}/BF_{102}$ and $BF_{208}/BF_{108}$ and exclude data from voxels 104, 204, 106, and 206.

FIG. 1e shows the result of applying the correction factor to image 100 to provide a corrected image 100'. Here each of the voxels in image 100' is obtained by multiplying the corresponding voxel in image 100 by the correction factor. Thus the blood flow value of voxel 102' in image 100' is CF times the blood flow value of voxel 102 in image 100, and similarly for all other voxels in image 100'. Although the correction factor is derived from corresponding blood flow images, it can be applied to correct images other than blood flow images. For example blood volume (BV) images can be corrected using this correction factor.

More generally, the correction factor derived from blood flow can be used to correct any image where the absolute scaling is not known, but which is known to scale with blood flow. Blood volume is one such quantity. Another example of such a quantity is cerebral metabolic rate of oxygen consumption (CMRO2), which is CBF multiplied by the oxygen extraction fraction (OEF). Thus, if a good OEF map is available, this can be combined with a CBF map corrected as described herein to provide a quantitative CMRO2 map.

BRIEF DESCRIPTION OF THE DRAWINGS

FIGS. 1a-e schematically illustrate a correction method according to an embodiment of the invention.

DETAILED DESCRIPTION

Figure 2A:
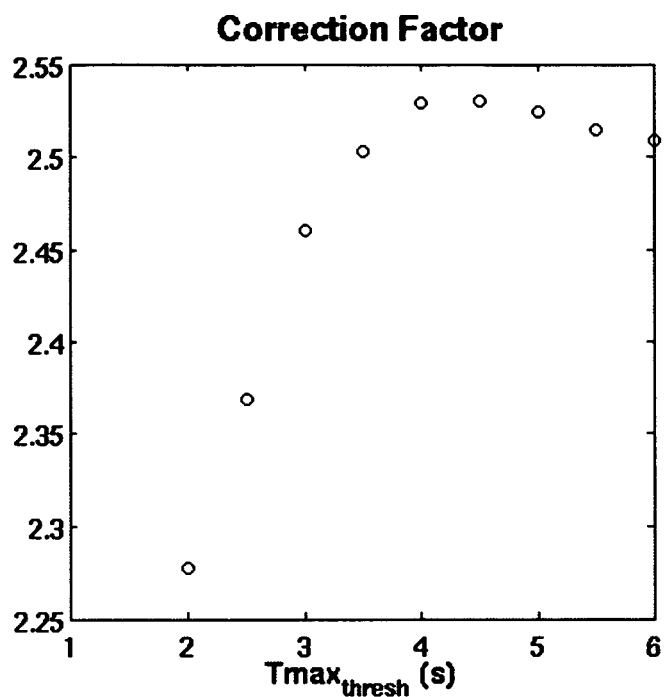
FIGS. 2a-d show experimental results relating to an embodiment of the invention.
Figure 2B:
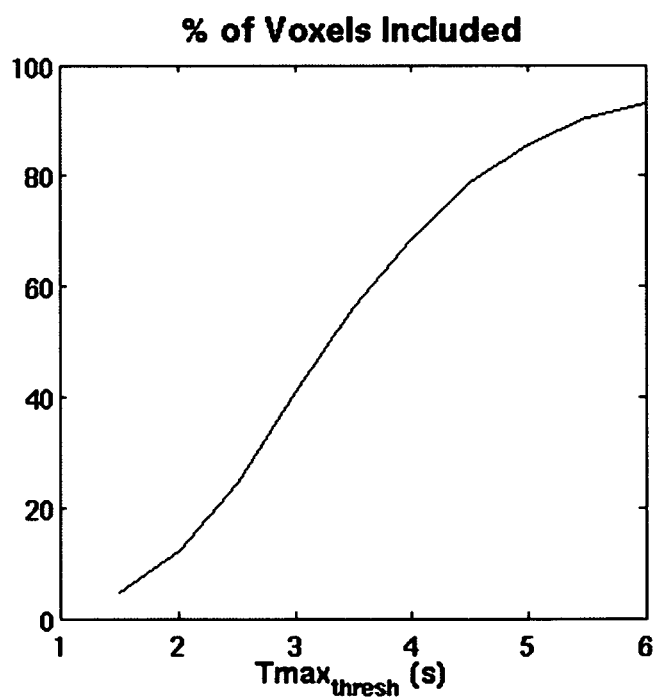
Figure 2C:
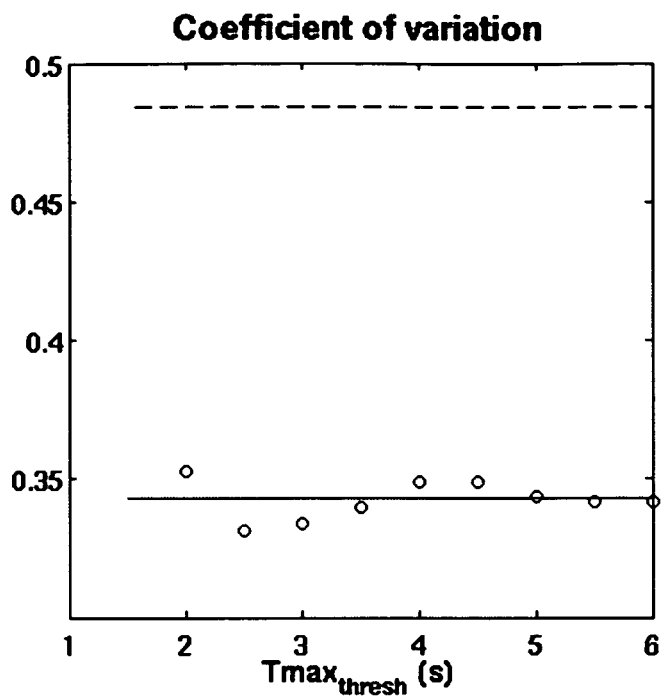
Figure 2D:
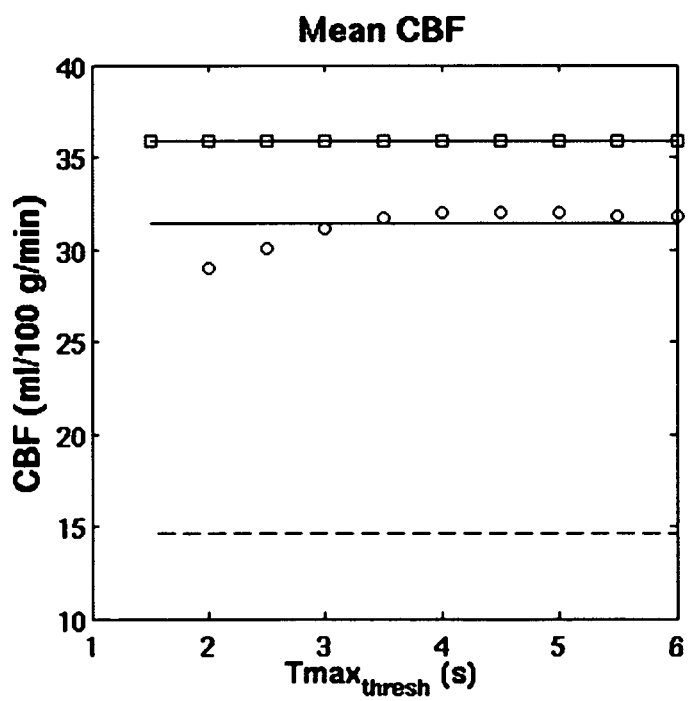

The following description relates to a specific and non-limiting example of the above-described principles, where an ASL correction was experimentally investigated for correcting DSC MRI CBF images. This particular method can be referred to as CAD-CBF for Combined ASL and DSC CBF.

To summarize the following, we have compared the CAD-CBF method to gold-standard xenon computed tomography (xeCT) in 20 patients with cerebrovascular disease using a range of Tmax threshold levels. CAD-CBF demonstrated quantitative accuracy as good as the ASL technique but with improved correlation in voxels with long Tmax. The ratio of MRI-based CBF to xeCT CBF (coefficient of variation [COV]) was 90±30% (33%) for CAD-CBF; 43±21% (47%) for DSC; and 91±31% (34%) for ASL (Tmax threshold 3 s). These findings suggest that combining ASL and DSC perfusion measurements improves quantitative CBF measurements in patients with cerebrovascular disease.

Introduction

Bolus dynamic susceptibility contrast (DSC) perfusion-weighted imaging (PWI) and arterial spin labeling (ASL) are two methods of measuring cerebral blood flow (CBF) using MRI, each with different strengths and weaknesses. ASL CBF levels are reliable in regions with rapidly arriving flow, but suffer from reduced SNR, CBF underestimation, and artifacts in regions with long arterial arrival times. In theory, DSC-based CBF measurements are unaffected by long arrival times if Fourier-based or delay-invariant block-circulant singular value decomposition deconvolution methods are used. However, absolute quantitation is challenging for many reasons, including uncertainties regarding the arterial input function (AIF) partial volume amount, the effect of vessel orientation on contrast relaxivity, the nonlinear relationship between transverse relaxivity and contrast concentration, clipping of AIF signal due to high tracer concentrations, and susceptibility-based voxel shifting. For these reasons, both techniques have yet to be fully embraced by the neuroimaging community for evaluating patients with cerebrovascular disease.

This study describes a calibration method that uses ASL CBF measurements in regions with short transit delays (as measured by the AIF-normalized time-to-peak of the residue function [Tmax]) to provide a patient-specific correction factor (CF) for DSC CBF measurements. We have termed this method "Combined ASL and DSC CBF," or CAD-CBF. We hypothesize that in patients with cerebrovascular disease, the CAD-CBF method will have less bias and is more precise with respect to a gold-standard CBF method. We also hypothesize that application of such a correction factor will improve CBF measurements in long arterial arrival time regions compared with ASL. To test this, we have evaluated 20 patients with known cerebrovascular disease who received xenon CT (xeCT) and MR perfusion imaging. XeCT is a gold-standard perfusion measurement which uses a diffusible tracer (xenon gas) that is inhaled by the patient, and which permits CBF measurement using the autoradiographic ("Kety-Schmidt") method.

Materials and Methods

Patient Population

The study was approved by the Institutional Review Board and was HIPAA compliant. Patients were enrolled if they had symptoms concerning for cerebral ischemia (acute, subacute, or chronic) or transient ischemic attack, and were willing to undergo the xeCT CBF study. To be included in the study, the stable xeCT and MRI studies had to occur within a 48 hr period.

20 patients met the inclusion criteria (11 men, 9 women; mean age 53 yrs, range 25-74 yrs). Their clinical indications were as follows: 13 Moyamoya disease, 4 acute ischemic stroke, 3 transient ischemic attacks (TIA); of these, 5 had unilateral internal carotid occlusion, while 2 had bilateral internal carotid artery occlusion. The root-mean-squared time difference between the xeCT and MRI studies was 27 hrs. In 11 of 20 patients (55%), xeCT was acquired before MRI.

xeCT CBF

Computed tomography (CT) was performed using a GE LightSpeed 8 detector scanner (GE Healthcare, Waukesha, Wis., USA) integrated with a stable xenon enhancer system (Diversified Diagnostic Products, Inc., Houston, Tex., USA). The xeCT protocol interrogated 4 contiguous slices (axial mode, slice thickness 10 mm, FOV 25 cm, 80 kVp, 240 mA) beginning at the level of the basal ganglia, aligned with the superior orbitomeatal axis. 8 sets of images were acquired at 45 s intervals, and the total time for the xeCT examination was 6 min. The first 2 time points were acquired while the patient breathed room air, and the remaining 6 time points were acquired with the patient breathing 28% xenon (Xe) gas, 20% oxygen, remainder air through a snug facemask. An end-tidal gas analyzer recorded expired Xe concentration, which was associated with the alveolar Xe concentration. The alveolar Xe concentration was assumed to correspond to the arterial Xe concentration, a reasonable approximation except in patients with severe respiratory disease and abnormal alveolar-to-arterial gradient. CBF was calculated using the Kety-Schmidt method by the manufacturer's dedicated commercial software (Diversified Diagnostic Products, Inc., Houston, Tex., USA). The output was CBF maps with in-plane spatial resolution on the order of 2-3 mm.

Magnetic Resonance Imaging

All MRI scans were performed at 1.5 T (Signa LX/i, GE Medical Systems, Waukesha, Wis., USA). Anatomic imaging was performed in addition to the perfusion measurements, and always included fluid-attenuated inversion recovery (FLAIR) and diffusion-weighted imaging (DWI) with a b-value of 1000 s/mm$^2$.

DSC was performed using gradient-echo (GRE) echo planar imaging (EPI) during passage of 0.1 mmol/kg of either gadopentetate dimeglumine (Magnevist, Berlex Laboratories, Wayne, N.J.) or gadodiamide (Omniscan, GE Healthcare, Waukesha, Wis.) delivered using a power injector at 4 cc/s. Image readout was performed using a multishot, multi-echo GRAPPA EPI sequence with an acceleration factor of 3 and TR/TE of 1225/(17,30,52) ms. 12-15 axial slices of 5 mm thickness separated by 1.5 mm interslice gap covered the entire supratentorial brain. In-plane resolution was 2.6 mm (matrix 96×96, FOV 240 mm). The DSC images required 2 min to acquire. Again, the slices were aligned with the superior orbitomeatal axis.

Automated AIF and venous output function (VOF) detection and deconvolution with block-circulant singular value decomposition (SVD) were performed, using a regularization threshold of 15% of the maximum singular value, to create maps of CBF, cerebral blood volume (CBV), mean transit time (MTT), and AIF-corrected time-to-peak of the residue function (Tmax). Transverse relaxivity change ($\Delta R_2^*$) was calculated using a weighted least-squares fit of the signal intensity from the three acquired echoes. A nonlinear relationship between blood tracer concentration and transverse relaxivity was assumed for tissue, according to the literature. For the tissue signal, a linear relationship between the change in transverse relaxation rate, $\Delta R_2^*$, and gadolinium concentration, c(t), was used:

$$c(t) = \frac{\Delta R_2 * (t)}{r_2} \quad (1)$$

where a relaxivity of $r_2$=0.044 (ms mM)$^{-1}$ was assumed for gadolinium at 1.5 T. For the AIF, a quadratic relationship between relaxivity and concentration was used:

$$\Delta R_2^*(t) = ac(t) + bc(t)^2 \quad (2)$$

where a=7.6×10$^{-3}$ (ms mM)$^{-1}$ and b=574×10$^{-6}$ (ms mM$^2$)$^{-1}$ for 1.5 T GRE.

Pulsed continuous ASL was performed using a labeling period (TL) of 1500 ms, followed by a 2000 ms post-label delay (w). Readout was accomplished with a 3 dimensional (3D) background suppressed fast-spin-echo (FSE) stack-of-spirals method. Multi-arm spiral imaging was used, with 8 arms and 512 data points acquired on each arm (bandwidth ±62.5 kHz), yielding in-plane spatial resolution of 3 mm. Forty 4-mm thick slices in the axial plane were acquired without intraslice gaps. Because the spirals are interleaved, both echo time (TE) (2.5 ms) and total readout time (4 ms) could be kept quite short, resulting in excellent performance in high susceptibility regions. Repetition time (TR) was approximately 5.5 s. A high level of background suppression was achieved by the use of 4 separate inversion pulses placed after the labeling pulse during the post-label delay period (at 1.49 s, 0.68 s, 0.25 s, and 0.06 s before readout). The sequence required 6 min to acquire, which included proton density images required for CBF quantitation. Post-processing was performed using an automated reconstruction script that returned CBF images directly to the scanner console within 1 min. CBF (in ml/100 g/min) was calculated in each voxel using the following equation:

$$CBF = 6000 \frac{\lambda(1 - \exp(-2.0\ s/1.2\ s))\exp(w/T_{1blood})}{2\alpha T_{1blood}(1 - \exp(-TL/T_{1blood}))} \frac{\Delta S}{S_0} \quad (3)$$

where $\lambda$ is the brain:blood partition coefficient (0.9 ml/g), w is the post-label delay (1.5 s), $T_{1blood}$ is the $T_1$ of arterial blood at 1.5 T (1.4 s), $\alpha$ is the labeling efficiency (0.85), TL is the labeling duration (1.5 s), $\Delta S$ is the ASL difference signal (i.e. label-control image), and $S_0$ is the proton density signal intensity. The term (1−exp(−2.0 s/1.2 s)) in the numerator reflects the presence of a saturation pulse that is applied in the proton-density images and allows conversion between measured MR signal ($S_0$) and the unperturbed longitudinal gray matter magnetization.

Combining ASL and DSC CBF Measurements

To determine an ASL-based global correction factor (CF), we determined the location of all voxels with relatively rapid arterial arrival time as measured by the DSC Tmax maps. Multiple different Tmax thresholds (Tmax$_{thresh}$) were examined, ranging from <1.5 s to <6 s at 0.5 s intervals, as well as an infinite Tmax (i.e., all voxels were used for determining the CF). We found that shorter Tmax$_{thresh}$ (i.e., less than 1.5 s) did not reliably include voxels in all patients for the subsequent calculations. While in practice, it is reasonable to choose only voxels with the shortest Tmax, we examined these other conditions to evaluate the sensitivity to Tmax threshold choice and any potential tradeoffs. After 3D rigid body registration of ASL and DSC, the mean CBF calculated from only the voxels that met the Tmax criteria were calculated for both the ASL and DSC, yielding a patient-specific correction factor:

$$CF = \left\{ \frac{CBF_{ASL}(r)}{CBF_{DSC}(r)} \right\}, \quad (4)$$

which is the mean of voxels r in which Tmax<=Tmax$_{thresh}$.

This dimensionless scaling factor was then multiplied with the DSC CBF map to determine the "corrected" hybrid ASL-DSC CBF, which we term CBF$_{CAD}$:

$$CBF_{CAD} = CF \times CBF_{DSC} \quad (5)$$

FIG. 1 is a schematic of the steps taken during this process.

Data Analysis

Rigid body rotation based on mutual information using SPM5 (Wellcome Department of Imaging Neuroscience, University College of London) was used to co-register the MR and xeCT images. Typically, FLAIR anatomical images were co-registered to the 4 contiguous xeCT slices, and this transformation was then applied to the DSC and ASL CBF maps. Each slice was then divided into 1 cc cubic Regions of Interest (ROIs) using a "battleship grid" consisting of contiguous square regions-of-interest. This yielded a large number of voxels with equal spatial resolution (about 400 voxels per patient) that were free of any possible ROI selection bias.

Voxels belonging to the ventricles and cortical sulcal CSF were excluded by thresholding the diffusion-weighted images manually. In each patient, scatter plots of the individual DSC and ASL CBF maps with xeCT were created, yielding slope, intercept, and correlation coefficient (R).

The global mean CBF was calculated by averaging the (~400) individual ROI measurements described above in each patient. The MRI-based CBF measurements were normalized by the xeCT CBF value using the CBF ratio:

$$CBF\ ratio_x = \frac{MRI_x CBF_{mean}}{xeCT CBF_{mean}} \quad (6)$$

where $x \in (DSC, ASL, CAD)$ where all values are global means. Ideally, this value should be 1, which would represent exact correspondence (i.e., no bias) between the two techniques. To determine the precision of the CBF between patients, the coefficient of variation (COV), or normalized between-patients standard deviation, was used:

$$COV = \frac{SD_{CBF\ ratio}}{mean_{CBF\ ratio}} \quad (7)$$

$$= \frac{\sqrt{\sum_n (CBF_{ratio_n} - \overline{CBF\ ratio})^2 / (n-1)}}{\overline{CBF\ ratio}}$$

where the overbar represents the mean of all n patients. Lower COV represents a more precise measurement. A COV of 0% means that each MRI-based CBF measurement corresponds to the xeCT CBF measurements to the level of a patient-independent scaling factor.

CBV was also calculated from the DSC maps before correction, using the ratio of the integrated tissue and VOF concentration-time curve; post-correction CBV maps were created by multiplying the pre-correction DSC images by the same correction factor described above.

Linear regression was performed comparing the mean xeCT-based and MRI-based CBF measurements between patients. All post-processing was performed using Matlab 7.3 (Mathworks Inc., Natick, Mass., USA). Stata Release 9.2 (StataCorp LLP, College Station, Tex.) was used for all statistical calculations. All values are reported as mean±SD. p<0.05 was considered significant.

Results

FIGS. 2a-d demonstrate the effect of varying $Tmax_{thresh}$. More specifically, these figures show the effect of Tmax threshold on (a) the mean correction factor, (b) the percentage of total voxels satisfying the inclusion criteria, (c) the coefficient of variation of the CBF ratio, and (d) measured CBF. Here the dashed lines relate to DSC results, the circles relate to CAD-CBF results, and the squares relate to xeCT results.

In short, we found that the precise threshold was not critical: within the range from 2 to 6 s, the mean CF ranged between 2.28±1.32 and 2.53±1.37. Without any thresholding based on the Tmax lesions (i.e., using all co-localized voxels in the ASL and DSC scans), CF was 2.48±1.32. However, the CF in individual patients varied significantly, consistent with the idea that this is a patient-specific factor; for example, using a Tmax threshold of 3 s, the range of the CF in the different patients ranged from a low of 1.02 to a high of 6.71.

As the threshold increases, more voxels are included in each patient for the calculation of CF (FIG. 2b), with about 50% of voxels included for Tmax between 3 and 4 s. Based on the improved precision and low bias, we believe that a Tmax of about 3 s (i.e., in a range from 2 s to 4 s) represented the best operational choice for $Tmax_{thresh}$ in this patient population. Table 1 below presents the mean CBF data for xeCT, uncorrected DSC, ASL, and the combined method for a range of $Tmax_{thresh}$, including non-thresholded (i.e., $Tmax_{thresh}$=infinity). CBF measured using the CAD approach had a bias roughly equivalent to the ASL method, but the precision of the measurement, as reflected by the COV improved, decreasing to 32% from 47% for $Tmax_{thresh}$ of 3 s.

TABLE 1

| Method | $Tmax_{thresh}$ | CBF (ml/100 g/min) | CBF Ratio | COV |
|---|---|---|---|---|
| xeCT (gold-standard) | — | 35.8 ± 7.7 | — | |
| DSC | — | 14.6 ± 6.3* | 0.43 ± 0.21 | 47% |
| ASL | — | 31.4 ± 9.9 | 0.91 ± 0.31 | 34% |
| Combined ASL-DSC ("CAD-CBF") | 2 s | 29.0 ± 10.1 | 0.83 ± 0.29 | 35% |
| | 3 s | 31.2 ± 9.8 | 0.90 ± 0.30 | 33% |
| | 4 s | 32.0 ± 10.1 | 0.93 ± 0.32 | 34% |
| | 5 s | 32.0 ± 10.0 | 0.93 ± 0.31 | 33% |
| | 6 s | 31.8 ± 10.0 | 0.92 ± 0.31 | 32% |
| | ∞ | 31.4 ± 9.9 | 0.92 ± 0.31 | 32% |

All values mean ± SD.
*Significantly different from xeCT CBF (p < 0.01, paired t-test)

Figure 3:
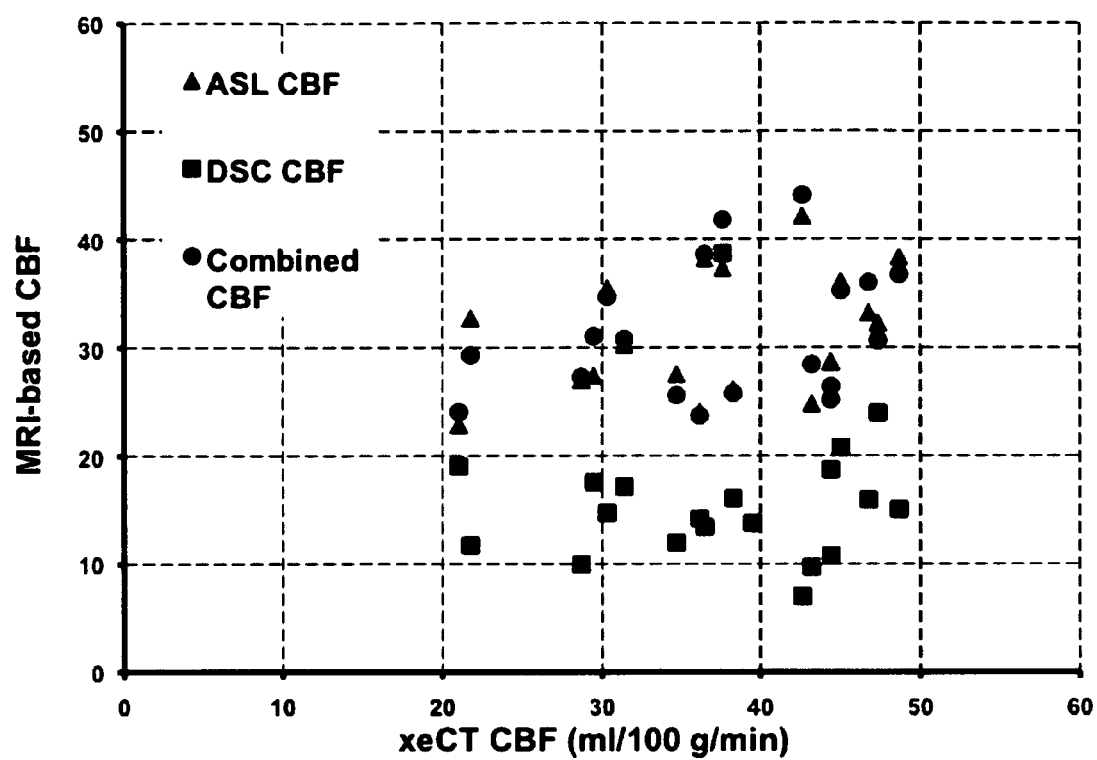
FIG. 3 shows comparison of several MRI CBF methods, including the use of a correction factor according to principles of the invention, to a gold standard for CBF.

FIG. 3 shows a comparison of ASL (triangles), uncorrected DSC (squares), and CAD (circles) mean global CBF compared with gold-standard xeCT CBF. Data points shown are mean CBF values, which include all imaged tissue, and are a mixture of gray and white matter for each patient. Note the improved bias in the measurement of the ASL and CAD CBF methods compared with the uncorrected DSC method. The correlation of both the ASL and the CAD CBF maps was 0.23 (p<0.05), while the correlation of the uncorrected DSC CBF images was 0.04 (p=NS).

Figure 4A:
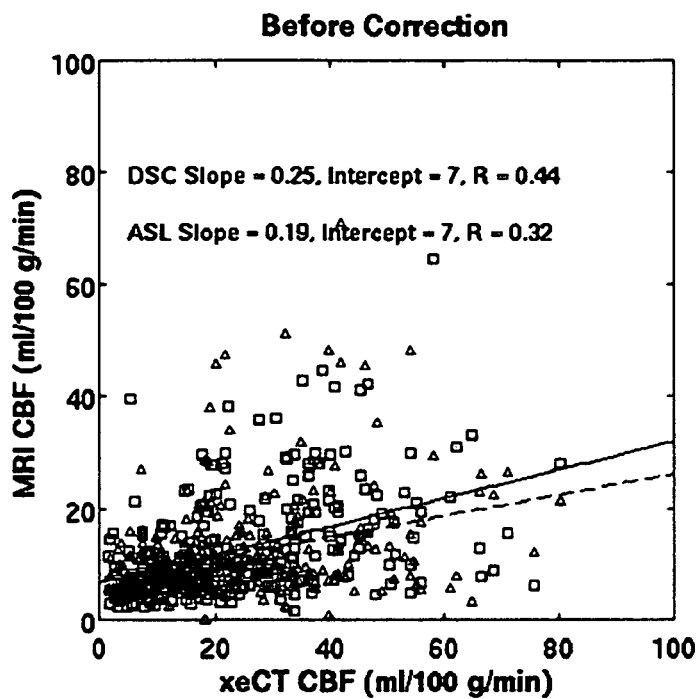
FIG. 4a shows uncorrected MRI CBF results compared to a CBF gold standard.
Figure 4B:
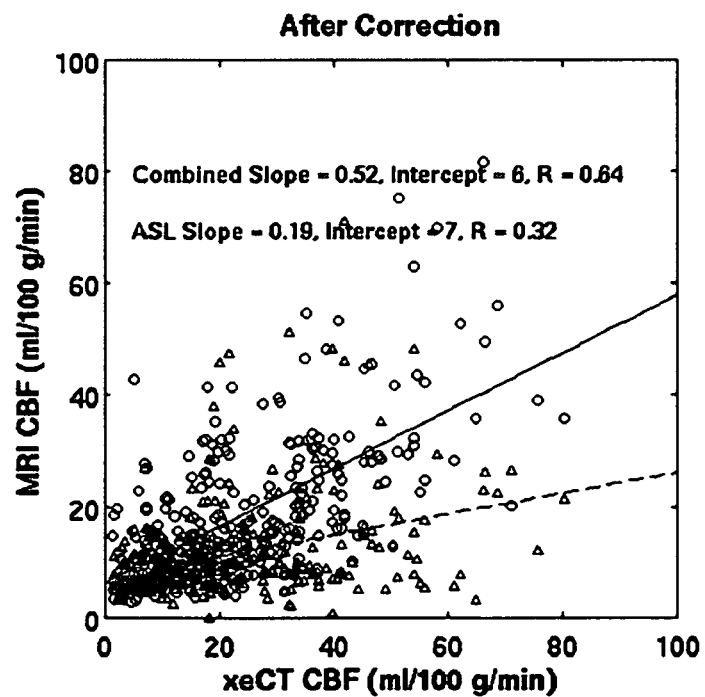
FIG. 4b shows corrected MRI CBF results compared to a CBF gold standard.

FIGS. 4a-b show a comparison of correlation between the MRI techniques and xeCT CBF in regions with long arterial arrival delays (Tmax>=7.5 s) before (FIG. 4a) and after (FIG. 4b) ASL-based correction in all patients (n=289 regions). The solid line on FIG. 4a is the DSC fit. The solid line on FIG. 4b is the CAD-CBF fit. The dashed lines on FIGS. 4a-b show the ASL fit. $Tmax_{thresh}$ was 3 s. Note the improved correlation of CAD-CBF (R=0.64) over either the ASL (R=0.32) or the DSC uncorrected (R=0.44) method alone.

In individual patients, both ASL and uncorrected DSC had similar correlation for all voxels (R=0.34±0.16 for ASL, R=0.39±0.13 for DSC). Multiplication of the DSC images by a global correction factor will not improve correlation of individual CBF ROI measurements in individual patients; however, when ROIs from all patients are combined, there was a significantly improved correlation of the $CBF_{CAD}$ maps (R=0.32 for CAD-CBF, R=0.30 for ASL, R=0.26 for DSC; n=6496 voxels, p<0.05 for all values being different from each other). This effect was particularly evident when considering only voxels with long Tmax (one example is shown as FIGS. 4a-b, for $Tmax_{thresh}$ of 3 s, examining only voxels with Tmax>7.5 s). In these regions, the correlation of combined maps is higher than that of the ASL CBF maps.

While we did not have a gold-standard for evaluating CBV, we note that the correction factor above can be applied to these maps, and can be compared with literature values. The mean CBV in the brain increased from 1.63±0.79% (pre-correction) to 3.50±1.42% (post-correction) for a $Tmax_{thresh}$ of 3 s.

Discussion
Problems with Existing ASL and DSC CBF Methods

ASL has been shown to accurately measure quantitative CBF in normal volunteers, but it has not been validated in a patient population with a wide variety of cerebrovascular disease and extensive collateral flow. In particular, CBF errors are known to occur in regions with prolonged arterial arrival times, which may lead to CBF under- or overestimation, depending on the precise relationship between arterial arrival time and the sequence's post-label delay time, as well as whether vessel suppression techniques are used. This can lead to a confusing picture and for this reason, many have doubted whether ASL could play a role in the diagnosis and management of patients with severe cerebrovascular disease, particularly acute stroke patients.

Some of these problems can be mitigated by the use of ASL sequences with multiple post-label delay times. Improved estimation of CBF in the setting of variable delay can be accomplished by non-linear fitting of the ASL difference signal data to a generalized kinetic model or by using a "model-free" approach, in which the difference between non-vessel suppressed and vessel suppressed images acts as an AIF. However, this method cannot be used for regions supplied by very slow collateral pathways, in which no ASL difference signal is observed even for the longest post-label delays. Also, multiple post-label delay ASL sequences necessarily have either reduced SNR for individual time points or an overall increase in scan time.

DSC CBF methods yield robust relative CBF maps, especially if delay-invariant deconvolution methods are performed. However, prior studies have shown that the inter-subject variability with DSC CBF measurements is significant, which has been attributed to a host of factors, including AIF partial volume, vessel orientation sensitivity, AIF clipping due to signal saturation, non-linear contrast relaxivity, susceptibility-induced voxel location shifting, and differences in large vessel/small vessel hematocrit, such that absolute CBF quantitation is challenging in individual patients. While degradation of the AIF shape and regularization will contribute to quantitation errors, we hypothesize that the major contribution to CBF quantitation errors emanates from scaling issues due to the aforementioned effects on the AIF.

Combining DSC and ASL: the Best of Both Worlds?

Both DSC and ASL, when used in isolation, thus have difficulties measuring quantitative CBF in patients with cerebrovascular disease. However, the strength of each measurement can be leveraged using a combined ASL-DSC approach, we have termed CAD-CBF. ASL quantitation is robust in regions with normal arrival times; DSC can be used to identify precisely these voxels, e.g., by using the timing information that can be obtained from Tmax maps. Thus, a patient-specific CF can be determined by equating the mean CBF obtained from each method only in voxels with Tmax below a prespecified threshold. It is important to note that the precise CF is dependent upon any corrections that have been applied to scale the DSC data (e.g. brain density factor, relaxivity and relaxation rate look up table, and small/large vessel Hct correction) and therefore would likely vary depending on the exact implementation and post-processing steps used calculate absolute CBF. The method is only predicated on the assumption that the relative CBF maps produced by DSC are accurate, or at minimum, are more accurate than ASL. The CF value is applied to the entire DSC CBF data set, taking advantage of the better relative CBF properties of DSC in regions with long delay times, where ASL suffers from $T_1$-based label decay and arterial transit artifacts (e.g. incomplete arterial bolus arrival to the capillaries).

This general approach is flexible, and a similar CF can also be derived from and applied to spin-echo (SE) DSC sequences. In fact, this may be preferable, given that GRE-EPI is sensitive to large blood vessels (which should not be included in the perfusion measurement, as this would, in theory, lead to a "flow through artifact"). ASL and SE-DSC also share the characteristic of being most sensitive to perfusion at the microvascular level. This may explain the remaining small underestimation of CBF by about 10% in the combined CBF maps. The use of a patient-specific CF also obviates the need for determining the magnitude of the AIF, which is fundamentally problematic for SE acquisitions. This, in turn, would enable truly quantitative measurements of both microvascular CBF and CBV.

We found that the specific choice of $Tmax_{thresh}$ was not critical. This may seem non-intuitive, but we believe is due to the relatively small number of voxels with long Tmax in most patients with cerebrovascular disease. Thus we found that good results were achieved even without using a threshold (i.e., determining the CF based on all the voxels within the co-localized DSC and ASL volumes); such an approach might be feasible in most patients, and could reduce computational time and errors from noise in the Tmax maps. However, we believe the current approach is most prudent, given that the CF is likely to be sensitive to $Tmax_{thresh}$ for patients with large and/or bilateral lesions, such as those seen in Moyamoya disease or carotid terminus occlusions. We believe that the optimal level for $Tmax_{thresh}$ is around 3 s, as this resulted in the lowest intersubject variability accompanied by reasonably low bias compared with gold standard xeCT CBF. Also, at this threshold, 41.1±14.3% of voxels are used in the calculation, thus minimizing issues with noise that could occur with shorter $Tmax_{thresh}$.

The combined ASL-DSC method yields a better estimate of gold-standard CBF compared with either ASL or DSC used alone. Specifically, the CAD-CBF method has a bias and precision equal to or better than that for ASL, with improved correlation in voxels with long Tmax. The correlation of all voxels in all patients was also significantly increased using the combined method, though the overall difference was slight and may not be clinically relevant. However, this improvement was more pronounced in voxels with long Tmax (see FIGS. 4a-b), as expected, given the challenges of ASL imaging in such regions. Finally, while we could not compare the corrected CBV values with a gold-standard, the use of the correction factor did increase the mean whole-brain CBV (3.5±1.4%) to the level of literature values (3.8±0.7%) as measured by $C^{15}O$ PET.

The method does require that two perfusion studies be obtained, adding either 2 or 6 minutes to the protocol, depending on which sequence one considers to have added. The ASL sequence used in the current study obtains 3 NEX to increase SNR. This was done because we ask our clinicians to examine both ASL and DSC hemodynamic studies, and only 1 average for the ASL study results in poor image quality. However, for the purposes of measuring the CF, it is likely that fewer NEX are required, since the CF is derived from mean values calculated in a large ROI (usually about half of the total imaged volume); this would lead to a reduction in imaging time and could be incorporated into a "pre-scan" module of the DSC measurement. For the same reason, larger voxels can be used. The added SNR affords the use of parallel imaging which would further reduce scan time.

Conclusion

We have demonstrated a method that we have termed CAD-CBF based on combined DSC and ASL imaging methods, which has reduced bias and precision when compared to gold-standard xeCT CBF. A patient-specific scaling factor is derived from equating the CBF levels on the ASL and DSC images in regions with short arterial arrival times. Correlation between CAD-CBF method and xeCT CBF is improved, particularly in regions with long arterial arrival times. We believe the approach supports the use of both ASL and DSC in patients with cerebrovascular disease. For scaling purposes we anticipate that an ASL scan with a coarser resolution than used in this study would be sufficient. Thus, a much more time-efficient ASL method could be used that would minimize the additional time needed for this calibration measurement.

The invention claimed is:

1. A method for providing corrected quantitative results from magnetic resonance imaging (MRI), the method comprising:
    performing first imaging to provide at least a first blood flow (BF) image, wherein a modality of said first imaging is a modality other than arterial spin labeling (ASL) MRI;
    performing second imaging to provide at least an ASL BF image corresponding to said first BF image, wherein said second imaging is arterial spin labeling MRI;
    selecting some voxels of said first BF image according to a predetermined selection method to provide a set of selected voxels;
    calculating a correction factor CF equal to the ratio of ASL BF image to first BF image averaged over said selected voxels;
    applying said correction factor to one or more images provided by said first imaging to provide one or more quantitatively corrected images as output;
    wherein said predetermined selection method comprises selecting voxels that have a Tmax below a predetermined Tmax threshold, wherein the predetermined Tmax threshold is between 2 seconds and 4 seconds.

2. The method of claim 1, wherein said first imaging comprises MRI.

3. The method of claim 1, wherein said predetermined selection method comprises selecting voxels according to tissue type.

4. The method of claim 1, wherein said predetermined selection method comprises selecting voxels according to baseline BF.

5. The method of claim 1, wherein said predetermined selection method comprises selecting voxels according to absence of pathology.

6. The method of claim 1, wherein said predetermined selection method comprises applying a weighting factor to the selected voxels.

7. The method of claim 1, wherein said applying said correction factor comprises multiplying said CF and said first BF image to provide a quantitatively corrected BF image as output.

8. The method of claim 1, wherein said first imaging further comprises providing a blood volume (BV) image, and wherein said applying said correction factor comprises multiplying said CF and said BV image to provide a quantitatively corrected BV image as output.

9. The method of claim 1, wherein said imaging is cerebral imaging, wherein said first BF image is a cerebral blood flow (CBF) image, and wherein said ASL BF image is an ASL CBF image.

10. The method of claim 1, wherein said modality of said first imaging comprises dynamic susceptibility contrast MRI.

11. The method of claim 1, wherein the predetermined Tmax threshold is 3 seconds.

* * * * *